(12) United States Patent
Zwack

(10) Patent No.: US 6,313,621 B1
(45) Date of Patent: Nov. 6, 2001

(54) METHOD AND ARRANGEMENT FOR DETERMINING THE PHASE DIFFERENCE BETWEEN TWO TIMING SIGNALS

(75) Inventor: Eduard Zwack, Puchheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/153,958

(22) Filed: Sep. 16, 1998

(30) Foreign Application Priority Data

Sep. 16, 1997 (DE) .............................................. 197 40 700

(51) Int. Cl.[7] ............................ G01R 23/00; G01R 23/12
(52) U.S. Cl. ..................................... 324/76.52; 324/76.54
(58) Field of Search ............................. 324/76.54, 76.52, 324/76.55, 76.77, 76.82; 327/107, 175, 292, 277; 370/480; 348/180, 536

(56) References Cited

U.S. PATENT DOCUMENTS

| | | | |
|---|---|---|---|
| 3,783,258 | * | 1/1974 | Chwastyk .............................. 235/156 |
| 4,603,292 | * | 7/1986 | Russell ................................ 324/78 R |
| 4,805,021 | * | 2/1989 | Harlos et al. ......................... 358/160 |
| 5,790,612 | * | 8/1998 | Chengson et al. ................... 375/373 |
| 5,892,384 | * | 4/1999 | Yamada et al. ...................... 327/277 |

FOREIGN PATENT DOCUMENTS

| | | |
|---|---|---|
| 195 03 035 | 8/1996 | (DE) . |
| 0 274 606 | 7/1988 | (EP) . |
| 0 389 662 | 10/1990 | (EP) . |

* cited by examiner

*Primary Examiner*—Safet Metjahic
*Assistant Examiner*—E LeRoux
(74) *Attorney, Agent, or Firm*—Schiff Hardin & Waite

(57) ABSTRACT

A method and arrangement for determining the phase difference between two timing signals provides that the first timing signal is ed to a delay line multiple times, whereby the number of passes through the delay line is obtained. The phase difference is determined in that a first transit time information is determined that corresponds to that number of delay elements of the delay line that are passed through by the first timing signal during a differential time-span between the two timing signals. Second transit time information is further obtained corresponding to that number of delay elements passed through by the first timing signal during a timing pulse period of time second timing signal. The determination of the first and second transit time information occurs dependent on the number of total passes of the first timing signal through the delay line, respectively, which is obtained at the respective determination time.

10 Claims, 4 Drawing Sheets

METHOD AND ARRANGEMENT FOR DETERMINING THE PHASE DIFFERENCE BETWEEN TWO TIMING SIGNALS

BACKGROUND OF THE INVENTION

1. Field of the Invention

The present invention relates generally to a method for detecting the phase difference between two timing signals and to a corresponding apparatus for carrying out the method.

2. Description of the Related Art

The phase synchronization of two signals, particularly two digital timing signals, is important for many applications. A high-precision, failure-protected timing generator means is centrally installed in synchronously operated communication means, for example. The timing signals generated in this timing generator means are distributed via transmitting means to all components of a communication network together with the transmitted digital information, e.g. speech information. With the aid of timing generator means equipped with phase control loops (Phase Locked Loop, PLL), timing signals are generated in the components, the phases thereof matching the phases of the incoming high-precision reference timing signals (i.e. the transmitted, or respectively, distributed timing signals).

European Patent Document EP-B1-0389 662 teaches a timing generator means with a phase control loop, for example. In the timing generator means the timing signals formed in a voltage-controlled timing oscillator are synchronized with the incoming reference timing signals with respect to their phase, or respectively, frequency. The phase difference between the timing signals and the reference timing signals is detected with the aid of a delay line formed by serially connected delay elements and of a delay-line register. The reference timing signals run through the serially connected delay elements, whereby a transit time information representing the number of delay elements passed by the reference timing signal is transferred into the delay-line register at times determined by the subsequent timing signal, respectively. With the aid of the transit time information the phase difference between the timing signal and the reference timing signal is calculated in an evaluating means, e.g. a microcomputer, whereby the calculation usually occurs with the aid of a program implemented in the evaluating means.

As described above, the delay line is formed by a plurality of serially connected delay elements. European Patent Document EP-A2-0274 606 teaches such a delay line, for example. The delay elements, or respectively, transit time members are thereby realized by n and p channel field effect transistors and invertors formed therefrom. The delay elements can comprise various transit times on the basis of the component tolerances, particularly the semiconductor component tolerances. Since the previously described transit time information is represented by the number of passed delay elements, in the detection of the phase difference whereby the number of the passed delay elements is multiplied by the transit time of a delay element considerable differences arise between the detected—i.e. calculated transit—time and the actual transit time of the reference timing signal through the delay line.

A method and an arrangement were thus proposed in German Patent Document DE-A1-195 03 035, whereby the precision of the phase difference determination can be improved, since the actual delay time—i.e. the absolute transit time—of a delay element of the delay line is exactly determined prior to the determination of the phase difference.

The method taught by German Patent Document DE-A1-195 03 035 is further detailed below using the arrangement depicted in FIG. 4.

As shown in FIG. 4, a timing signal a and a reference timing signal b are fed to the arrangement via two input terminals. The reference timing signal b—represented by a positive timing pulse edge—reaches the input D of a first flip-flop 5 (D flip-flop) and is simultaneously fed to an input terminal of a AND logic element 7. The timing signal a is applied at the timing input of the first flip-flop 5 so that, for example, the edge alternation of the reference timing signal b with the subsequent positive edge of the timing signal a reaches the input D of a subsequent second flip-flop 6 (D flip-flop) via the output Q of the first flip-flop 5. The inverted output Q' of the first flip-flop 5 comprises a high potential up to the arrival of the positive timing pulse edge of the timing signal a, for example, so that with the incoming positive timing pulse edge of the reference timing signal b both inputs of the AND logic element 7 lie at a high potential, and thus the output of the AND logic element 7 assumes a high potential. In this way the positive timing pulse edge of the reference timing signal b is fed to a delay line 1 (FIG. 4) with the aid of the output signal b' of the AND logic element 7, this line consisting of a plurality of serially connected delay elements 8. The positive timing pulse edge of the reference timing signal b, or respectively, b' thus passes through the individual delay elements 8 of the delay line 1 in succession. The individual outputs OUT of the delay elements 8 of the delay line thereby constantly change their potential such that digital status information, or respectively, transit time information—which respectively represent the number of the delay elements 8 of the delay line 1 passed by the reference timing signal b or respectively, b'—can be tapped at the outputs OUT of the delay elements 8 of the delay line 1 (e.g. by means of a decimal/binary converter DEC/BIN CONVERTER).

Given the arrival of the subsequent—e.g. positive—timing pulse edge of the timing signal a, the status of the timing signal b is connected through from the input D of the first flip-flop 5 to its output Q. The inverted output Q' of the first flip-flop 5 consequently changes from an initially high potential to a low potential. This alternation of edges, or respectively, potentials is fed to a register 2—referenced register A (FIG. 4)—which consequently takes over and stores the released transit time information of the delay line 1. The coded transit time information taken over by the register 2 thus represent the number $m_1$ of delay elements 8 of the delay line 1 which are passed by the reference timing signal b, or respectively, b' during a differential time-span between the signal alternation of the reference timing signal b and the signal alternation of the subsequent timing signal a.

With the next—e.g. positive—timing pulse edge of the timing signal a, which is applied to the timing input of the second flip-flop 6, the edge alternation of the previously detailed reference timing signal b is connected through to the output Q of the second flip-flop 6. Another register 3—referenced register B—is actuated by these edge, or respectively, potential alternations of the output Q of the second flip-flop 6, this register thus taking over and storing further transit time information of the delay line 1. The coded transit time information now stored in the register 3 represent the number $m_2$ of the delay elements 8 passed by the edge alternation of the reference timing signal b, or respectively, b' during one period of the timing signal a.

Since the timing pulse period of the timing signal a is known, a microprocessor 4 that serves as an evaluating means can determine the actual delay time, or respectively, transit time of the delay elements 8 of the delay line 1 depending on the number $m_2$ of the delay elements 8 of the delay line 1 passed through during a timing pulse period of the timing signal a—which is stored in the register B—and on the known timing pulse period of the timing signal a by dividing the timing pulse period of the timing signal a by the number $m_2$. The microprocessor 4 can subsequently determine the actual differential time-span, or respectively, delay time between the two signals by multiplying the obtained actual delay time of each delay element 8 of the delay line 1 by $m_1$, the number of delay elements 8 of the delay line 1 that were passed during the differential time-span between the positive timing pulse edges of the reference timing signal b and of the timing signal a, for example—this number being filed in the register 2—and can calculate the phase difference within the timing signal a with the aid of the actual differential time-span, or respectively, the delay time with reference to the duration of the known pulse period of the timing signal a.

The arrangement depicted in FIG. 4 and the corresponding method for determining the phase difference between the timing signals a and b have the disadvantage, however, that a plurality of gates are necessary for determining the phase difference, particularly in the delay line 1, and the arrangement, or respectively, the method is dependent on technology.

SUMMARY OF THE INVENTION

It is thus the object of the present invention to provide a highly precise method for determining the phase difference between two timing signals as well as a corresponding arrangement whereby the outlay required for determining the phase difference is reduced and the method, or respectively, the arrangement can be employed independent of the technology selected.

This object is inventively achieved by a method for determining the phase difference between two timing signals, including the steps of a) feeding of a first timing signal to a delay line having a plurality of serially connected delay elements, so that the first timing signal passes through the individual delay elements of the delay line in succession, b) determination of a first total number of delay elements of the delay line that are passed through by the first timing signal during a differential time-span between a timing pulse edge of the first timing signal and the subsequent timing pulse edge—with the same polarity—of the second timing signal, c) determination of a second total number of delay elements of the delay line that are passed through by the first timing signal during a timing pulse period of the second timing signal, d) determination of the delay time of a delay element of the delay line dependent on the timing pulse period of the second timing signal and on the second total number of delay elements—which was determined in step c), and e) determination of a phase difference between the two timing signals dependent on the first total number of delay elements—which was determined in step b)—and on the delay time of each delay element of the delay line—which was determined in step d), wherein in step a) the first timing signal is fed to the delay line multiple times, and the number of the passes of the first timing signal through the delay line is determined, and that in the steps b) and c) the first and second total number of delay elements are determined dependent on the valid number of passes of the first timing signal through the delay line at the respective determination time.

The method is further defined in that in the steps b) and c) the first and second total number of passed delay elements is determined dependent on the number of delay elements of the delay line passed through by the first timing signal valid at the respective determination time.

As a further development, in step d) the delay time of a delay element is determined by dividing the timing pulse period of the second timing signal by the second total number of delay elements—which is determined in step c). In addition, in step e) the phase difference between the two timing signals is determined by multiplying the first total number of delay elements—which was determined in step b)—by the delay time of each delay element of the delay line—which was determined in step d). The delay elements of the delay line have an adjustable delay time, and that the delay time of the delay elements of the delay line is adjusted in order to compensate the phase difference between a timing signal exiting at the output of the delay line and the second timing signal.

The invention also provides an arrangement for determining the phase difference between two timing signals, having a delay line including a plurality of serially connected delay elements at which line a first timing signal is applied, so that the first timing signal passes through the individual delay elements of the delay line in succession, a first register for storing first transit time information corresponding to a first total number of delay elements of the delay line that are passed through by the first timing signal during a differential time-span between a timing pulse edge of the first timing signal and the subsequent timing pulse edge—with the same polarity—of the second timing signal, a second register for storing second transit time information corresponding to a second total number of delay elements of the delay line that are passed through by the first timing signal during a timing pulse period of the second timing signal, and an evaluating means that determines the delay time of a delay element of the delay line, as well as the phase difference between the two timing signals, dependent on the transit time information stored in the first and second registers, wherein a sequence control system which feeds the first timing signal to the delay line multiple times and a pass-through determination means which determines the number of passes of the first timing signal through the delay line, the first transit time information stored in the first register contain information about the number of passes of the first timing signal through the delay line during the differential time-span, and whereby the second transit time information stored in the second register contain information about the number of passes of the first timing signal through the delay line during the timing pulse period of the second timing signal.

Preferably, the pass-through determination means is a counter or a shift register. The evaluating means is formed by a microprocessor. Further, the evaluating means determines the delay time of the delay elements of the delay line using the transit time information stored in the second register, and the evaluating means determines the phase difference between the two timing signals using the thusly determined delay time of each delay element of the delay line as well as the first transit time information stored in the first register.

In one embodiment, the delay line contains ten delay elements. The delay elements of the delay line have an adjustable delay time, and that a phase compensating means is provided which adjusts the delay time of the delay elements of the delay line such that a phase difference between a signal exiting at the output of the delay line and the second timing signal is compensated. The phase compensating means is preferably integrated in the evaluating means.

The measured, or respectively, compared timing signal is inventively sent over the delay line a number of times. The number of passes through the delay line is obtained and counted. The determination of the numbers $m_1$ and $m_2$ of passed delay elements of the delay line—which number was previously explained using FIG. 4—occurs thereby dependent on the respectively obtained, or respectively, counted number of passes of the timing pulse edge of the measured timing signal through the delay line.

As in the prior art depicted in the FIG. 4, the transit time of the measured timing signal between one (e.g positive) timing pulse edge of the measured timing signal and a subsequent (e.g. positive) timing pulse edge of the other timing signal is obtained with the aid of a register. With another register the transit time of the measured signal during one pulse period of the other timing signal is obtained in order to thus determine the actual delay time, or respectively, transit time of each individual delay element of the delay line.

As already explained using the prior art depicted in FIG. 4, depending on the delay time thus determined with the aid of the other register, the time displacement between a (e.g. positive) timing pulse edge of the measured timing signal and a subsequent (e.g. positive) timing pulse edge of the other timing signal can be deduced on the basis of the transit time information stored in the register mentioned first, and the phase difference existing between the two timing pulse signals can be calculated.

Since the measured timing signal is sent multiple times through the delay line, and the number of the passes is determined, the length of the delay line—i.e. the number of the serially connected delay elements—can be considerably reduced. The outlay required for determining the phase difference between two timing signals is thereby considerably reduced.

Since the transit time, or respectively, delay time of the delay elements of the delay line can be determined anew after each timing pulse edge, voltage fluctuations or temperature modifications can be taken into consideration by the evaluating means which ultimately determines the phase difference.

Furthermore, the inventive method, or respectively, the inventive arrangement can be transferred into a new technological design without modification, even if the transit time of an element were to halve or quarter, for example, since the computational rule for the determination of the actual transit time does not change. Thus the gate transit time, or respectively, delay time of a new ASIC module equals approximately 0.1 ns, for example.

The phase resolution for determining the phase difference between timing signals arising in communication means can thus be considerably increased without adjustment of the timing pulse used for determining the phase difference.

According to another development of the invention, controlled delay elements, or respectively, transit time members can be utilized, such as are described in European Patent Document EP-A2-0274 606, for example. The counters, or respectively, a corresponding shift register provided for the detection of the passes of the measured timing signal through the delay line, can be involved in the control circuit, so that the number of the transit time members, or respectively, the delay elements is further reduced.

The inventive method, or respectively, the inventive arrangement comprises a very high precision, or respectively, resolution on the basis of the determination of the actual, or respectively, absolute transit time of the delay elements of the delay line.

The inventive method, or respectively, the corresponding arrangement can consequently be employed in a phase measuring means of high-precision phase control circuits. Such high-precision phase control circuits are provided in timing means of communication means, particularly of digital and processor-controlled transmission means. Beyond this, the inventive method, or respectively, the corresponding arrangement can be employed in all communication means wherein high-precision phase control circuits are synchronized with the aid of incoming high-precision reference timing signals.

However, the present invention is not limited to employment in communication means, but can be applied anywhere where phase differences between two timing signals generally need to be determined.

BRIEF DESCRIPTION OF THE DRAWINGS

The invention is further detailed below using preferred exemplifying embodiments with reference to the drawing.

DETAILED DESCRIPTION OF THE PREFERRED EMBODIMENTS

Figure 1:
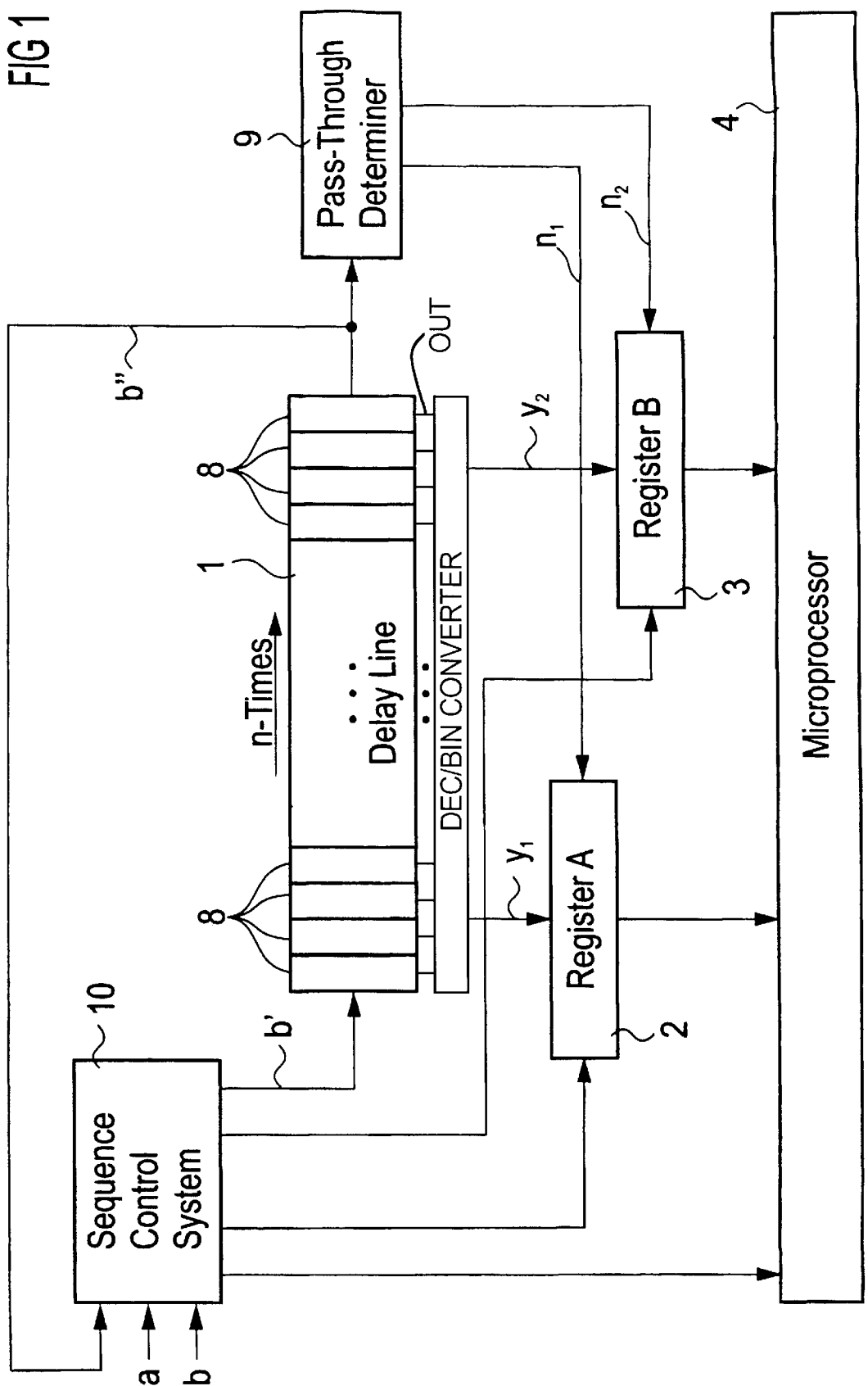
FIG. 1 is a simplified block wiring diagram of a first exemplifying embodiment of the inventive arrangement for determining the phase difference between two timing signals.

FIG. 1 shows a simplified block wiring diagram of a first exemplifying embodiment of the inventive arrangement for determining the phase difference between two timing signals a and b, whereby the timing signal a can be a matter of a local timing signal of a component of a communication apparatus, and timing signal b can be a matter of a reference timing signal fed centrally to the component of the communication apparatus.

Figure 4:
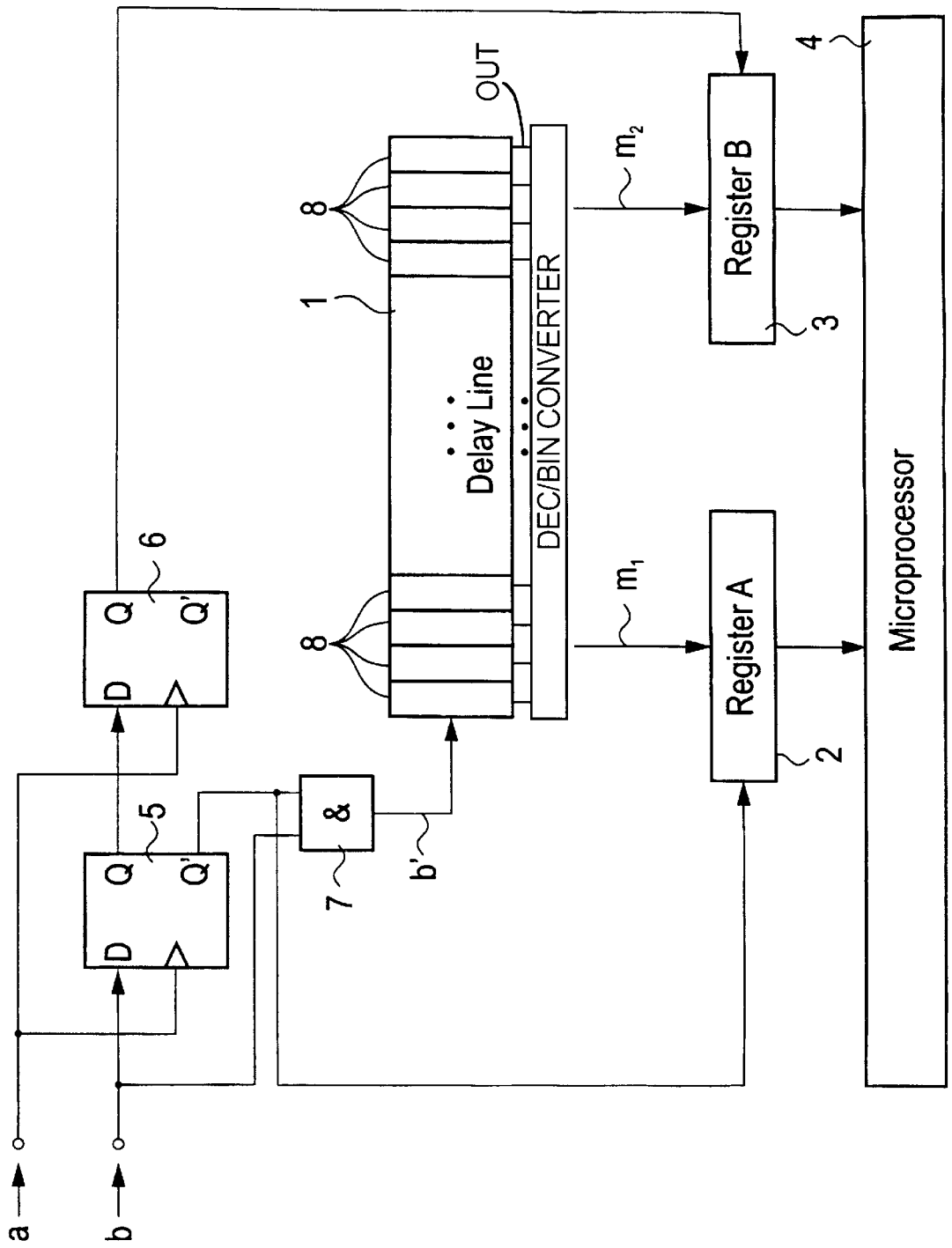
FIG. 4 is a simplified block wiring diagram of a known arrangement for determining the phase difference between two timing signals.

In principle the arrangement depicted in FIG. 1 functions like the known arrangement depicted in FIG. 4, so that with respect to the description of the individual components depicted in FIG. 1, reference can be made to the specification of FIG. 4, since this applies to the arrangement depicted in FIG. 1 with the following exceptions.

In contrast to the arrangement depicted in FIG. 4, the timing signal b, or respectively, b' is sent over the delay line 1 multiple times. As previously explained, the delay line 1 consists of a plurality of serially connected transit time members, or respectively, delay elements which can be respectively realized by n and p channel field effect transistors and invertors formed therefrom, for example.

To this end, a sequence control system 10 is provided which can be constructed from the linking of flip-flops with corresponding logic members, or elements, analogously to FIG. 4. The sequence control system 10 applies the received timing signal b, or respectively, a corresponding timing signal b' at the delay line, which signal is fed to the sequence control system 10 again as an output signal b" and reapplied at the delay line subsequent to passing through the individual delay elements 8 of the delay line 1, so that the delay line 1 is passed through n times, for example. With each passing through the delay line 1 a counter (or alternatively a shift register) 9 is incremented in order to obtain the number of passes of the timing signal b through the delay line 1.

As in FIG. 4, registers 2, or respectively, 3 (referenced register A, or respectively, register B) are provided, whereby the register 2 stores transit time information representing the number of delay elements 8 of the delay line 1 that are passed through by the timing signal b, or respectively, b' during a differential time-span between a timing pulse edge alternation of the timing signal b and a subsequent corresponding timing pulse edge alternation (i.e. a subsequent timing pulse edge alternation with the same polarity) of the timing signal a. As is further detailed below, the transit time information stored in register 2 are composed of the information $y_1$ delivered by the delay line 1 and information $n_1$ delivered by the counter 9. In contrast, the other register 3 stores transit time information representing the number of delay elements 8 of the delay line 1 that are passed through by the timing signal b, or respectively, b' during one timing pulse period of the timing signal a. The transit time information stored in the register 3 are composed of the information $y_2$ delivered by the delay line 1 and the information $n_2$ delivered by the counter.

A microprocessor is in turn provided as an evaluating means according to FIG. 1, which microprocessor determines the actual delay time, or respectively, transit time of the delay elements 8 of the delay line 1 using the transit time information stored in the register 3 as well as the prescribed and known timing pulse periods of the timing signal a, and which can determine the time displacement, or respectively, differential time-span between two corresponding timing pulse edges of the timing signal a and timing signal b—which corresponds to the phase difference between the two timing signals and b—by using the thusly determined delay time per delay element 8 of the delay line 2 and referring to the transit time information stored in register 2.

The function of the arrangement depicted in FIG. 1 is detailed below with reference to the time characteristics of the timing signals a and b depicted in FIG. 2.

With the actuation of the measured timing signal b, this is applied at the delay line 1 by the sequence control system 10 (cf. signal b'), and after the corresponding timing pulse edge of the timing signal b has passed through the delay line 1, this signal is fed back to the sequence control system 10 again (cf. signal b'), so that this can apply the corresponding timing pulse edge of the timing signal b at the delay line 1 once more. The timing signal b is thus sent over the delay line 1 multiple times. After each pass through the delay line 1 the counter 9 is correspondingly incremented.

Figure 2:
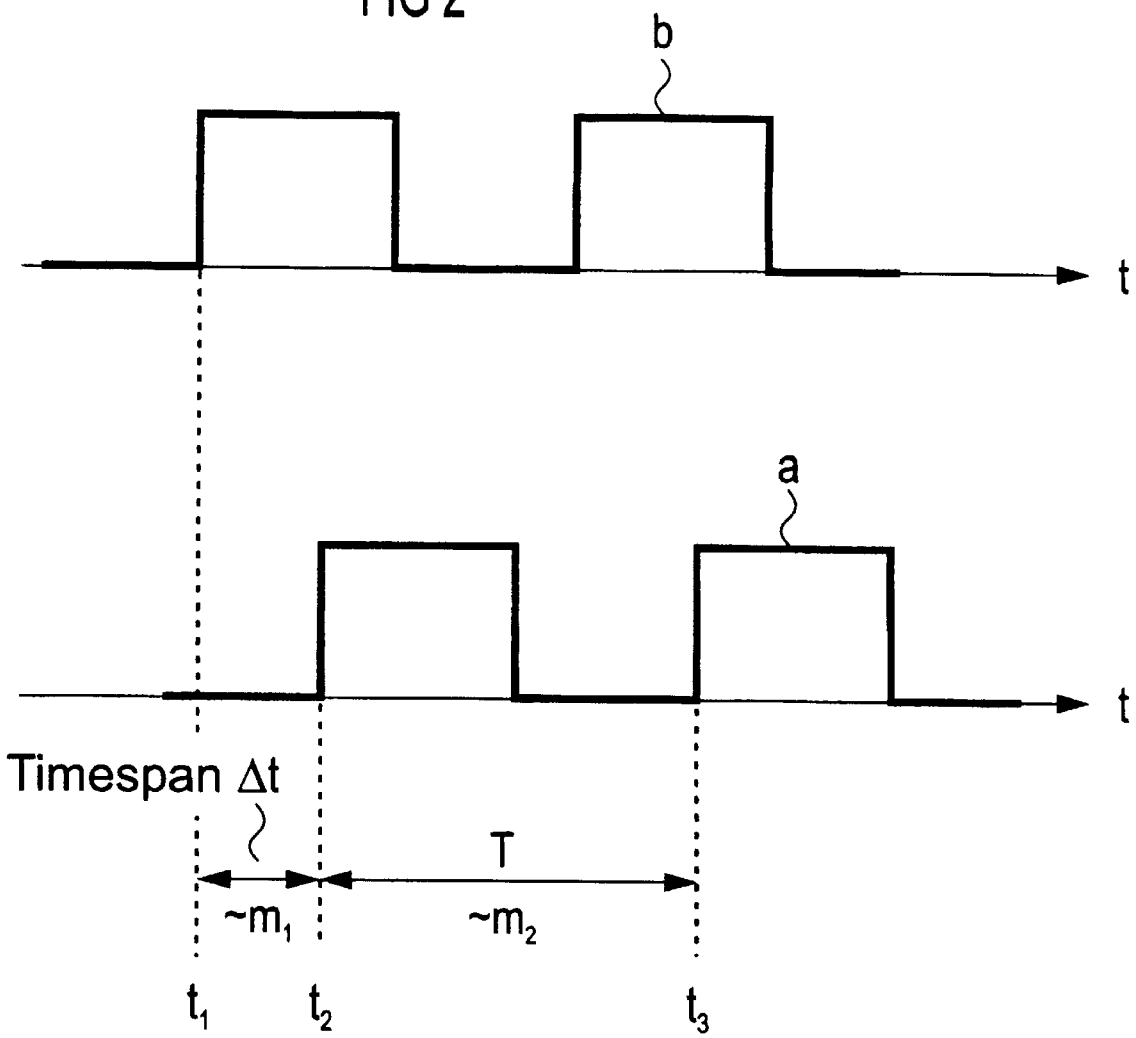
FIG. 2 is a pair of graphs of the time characteristic of two timing signals, for explication of the inventive method for determining the phase difference between the two timing signals.

Referring to FIG. 2, the positive timing pulse edge of the timing signal b is fed to the delay line 1 by the sequence control system 10 at time $t_1$, so that this positive timing pulse edge passes through the individual delay elements 8 of the delay line 1 (potentially multiple times).

The timing signal a which is also fed to the sequence control system 10 is shifted by a differential time-span $\Delta t$ relative to the timing signal b, whereby this differential time-span corresponds to the phase difference between the two timing signals a and b. This differential time-span $\Delta t$ must be determined, accordingly, in order to determine the phase difference between the timing signals a and b. This occurs with the aid of the register 2 depicted in FIG. 1. With the first positive timing pulse edge of the timing signal a, the register 2 is activated by the sequence control system 10 at time $t_2$ and takes over information from the delay line 1 and from the counter 9 which corresponds to the current number of passed delay elements 8 of the delay line 1 on the one hand, and to the number of complete passes of the timing signal b through the delay line 1 during the aforementioned differential time-span $\Delta t$, on the other. The two information items referenced $y_1$ and $n_1$ in FIG. 1 are stored in the register 2 at this time $t_2$ as the transit time information relevant to the differential time-span $\Delta t$.

With the presence of the next positive timing pulse edges of the timing signal a—i.e. following the expiration of a full pulse period T of the timing signal a—the other register 3 (FIG. 1) is activated by the sequence control system 10 and likewise takes over information $y_2$, or respectively, $n_2$ from the delay line 1 and from the counter 9, this information corresponding to the current number of delay elements 8 of the delay line 1 passed through by the timing signal b, or respectively, b' following the expiration of the full timing period T of the timing signal a, or respectively, to the number of complete passes of the timing signal b, or respectively, b' through the delay line 1.

The transit time information stored in the register 2 thus represent a total number $m_1$ of delay elements 8 of the delay line 1 which are passed through by the timing signal b, or respectively, b' during the differential time-span $\Delta t$, while the transit time information stored in register 3 represent a total number $m_2$ of delay elements 8 of the delay line 1 which are passed through by the timing signal b, or respectively, b' during a full timing pulse period T of the timing signal a. The following relationship thereby applies:

$$m_i = (n_i \cdot x) + y_i \text{ with } I=1, 2,$$

whereby x represents the number of the delay elements 8 of the delay line 1.

It is subsequently assumed by way of example that the delay line 1 comprises a total of 10 serially connected delay elements 8, whereby this number is considerably lower than in the arrangement depicted in FIG. 4, since the delay line 1, or respectively, the corresponding delay elements 8 are inventively passed through a multiple of times.

It is further assumed that the timing pulse period T of the timing signal a—i.e. the time between two positive (negative) timing pulse edges of the timing signal a—is T=110 ns. At time $t_2$ the register 2 takes over the binary information $y_1$="1100000000" from the delay line 1 and the information $n_1$="2" from the counter 9. This means that at the time $t_2$ depicted in FIG. 2 the timing signal, or respectively, the corresponding positive timing pulse edges have passed through the total of x=10 delay elements 8 of the delay line 1 twice already, whereby the first two delay elements 8 of the delay line 1 have additionally been passed through by the timing pulse edge of the timing signal b at that time. It is further assumed that at the time $t_3$ depicted in FIG. 2—i.e. following the expiration of the timing pulse period T of the timing signal a—the register 3 receives the binary information $y_2$="111100000" from the delay line 1 and the information $n_2$="5" from the counter 9. This means that, during the timing pulse period T of the timing signal a (FIG. 2), the (positive) timing pulse edge of the timing signal b, or respectively, b' has passed through the delay line 1 a total of five times and has additionally passed through the first five delay elements 8 of the delay line 1.

The microprocessor 4 can calculate the actual delay time of each delay element 8 of the delay line 1 on the basis of the transit time information stored in the register 3. The timing pulse period T of the timing signal a is known to the microprocessor 4 and is stored, for example. The delay time of each delay element 8, or respectively, the corresponding transit time of each delay element 8 results from the division of the timing pulse period T of the timing signal a by $m_2$, the total number of delay elements 8 of the delay line 1 that have been passed through by the timing signal b during this timing pulse period T. As has been explained already, the following applies thereby:

$$m_2=(n_2 \cdot x)+y_2=(5 \cdot 10)+5=55$$

For the delay time $t_d$ of each delay element 8 of the delay line 1, this accordingly yields the following:

$$t_d=T/m_2=110 \text{ ns}/55=2 \text{ ns}$$

Depending on this delay time $t_d$, the microprocessor 4 can determine the phase difference between the two timing signals a and b on the basis of the transit time information filed in the register 2. As has been explained already, the transit time information filed in the register 2 correspond to the total number $m_1$ of delay elements 8 that have been passed through by the timing signal b during the differential time-span Δt (FIG. 2). Analogously to the calculation of $m_2$, the following applies for $m_1$:

$$m_1=(n_1 \cdot x)+y_1=(2 \cdot 10)+2=22$$

A total of 22 delay elements 8 were passed through by the timing signal b during the differential time-span Δt, accordingly, so that on the basis of the delay time of each delay element 8 calculated using the contents of the register 3, the resulting differential time-span Δt is:

$$\Delta t=m_1 \cdot t_d=44 \text{ ns}$$

This differential time-span Δt corresponds to the phase difference between the two timing signals a and b.

Figure 3:
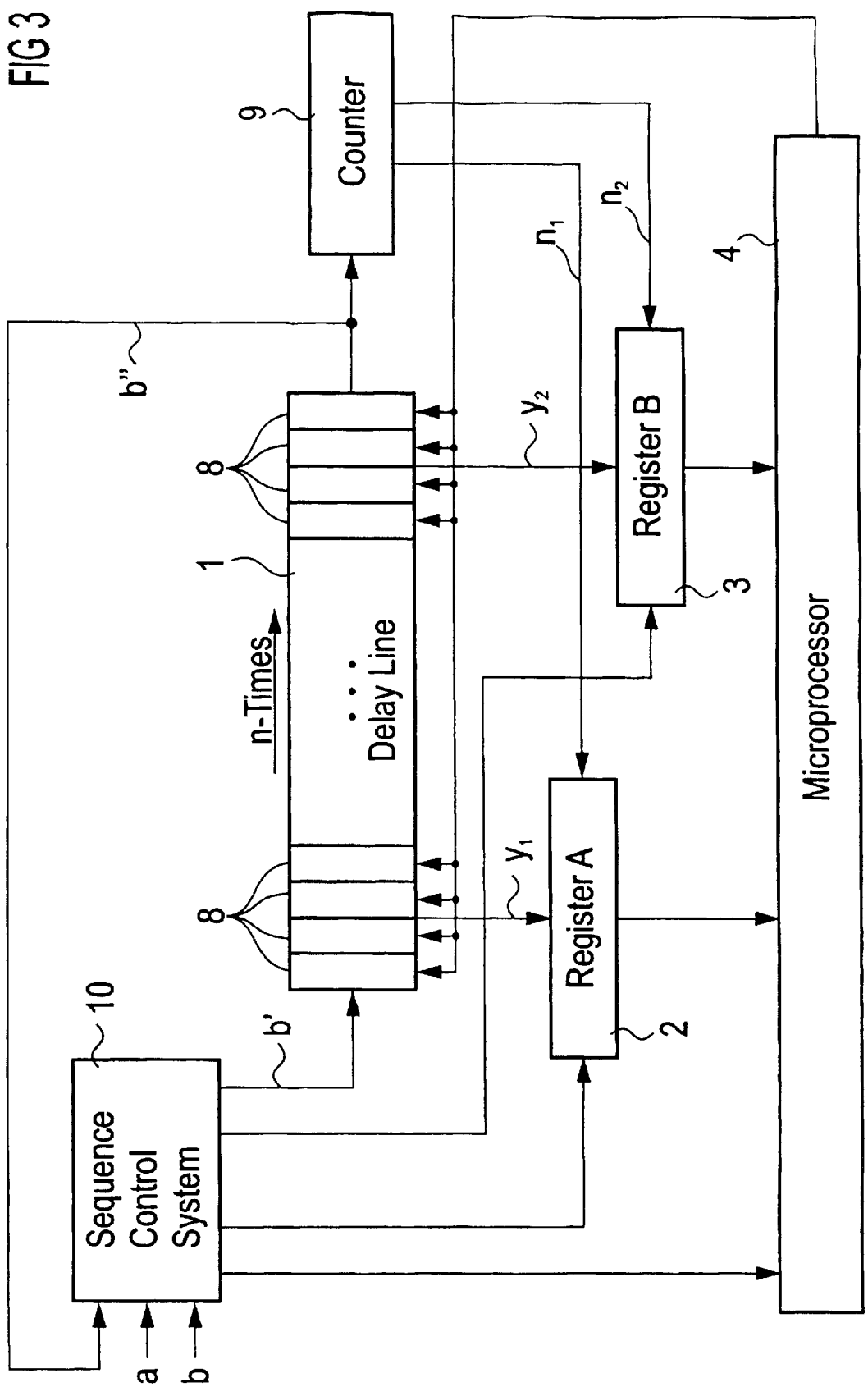
FIG. 3 is a simplified block wiring diagram of a second exemplifying embodiment of the inventive arrangement for determining the phase difference between two timing signals.

FIG. 3 shows a second exemplifying embodiment wherein, supplementing FIG. 1, the individual delay elements 8 of the delay line 1 are designed as controllable transit time members whose delay time is adjustable. European Patent Document EP-A2-0 274 606 already teaches a corresponding delay line with controllable transit time members. The individual transit time members, or respectively, delay elements 8 are realized by n and p channel field effect transistors and inverters formed therefrom, for example.

With the aid of the arrangement depicted in FIG. 3, the microprocessor can adjust the delay times $t_d$ of the individual delay elements 8 of the delay line 1 dependent on the determined phase difference such that the signal b" of the timing signal—which former signal arises in delayed fashion at the output of the delay line 1—comprises the same phase relation as the corresponding comparison timing signal, particularly as the timing signal a. The actuation of the individual delay elements 8 of the delay line 1 can of course also be taken over by a separate phase compensating means which is present in addition to the microprocessor 4 (FIG. 3) and which receives the previously mentioned comparison timing signal—e.g. the timing signal a—as well as the timing signal b" exiting at the output of the delay line 1 on the one hand, and adjusts the delay time of the individual delay elements 8 of the delay line 1 at the output side, on the other hand.

Compared to the known arrangement depicted in FIG. 4, the invention detailed in FIGS. 1 to 3 comprises the essential advantage that the number of delay elements 8 required for the delay line 1 is reduced considerably, since the individual delay elements 8 can be passed through multiple times. The outlay required for the determination of the phase difference between the two timing signals is thereby significantly lowered, and the switch construction of the inventive arrangement is lowered considerably. To confirm the example described above, the provision of ten delay elements 8 in the delay line 1 has proven advantageous in particular. Of course, in principle the delay line 1 can also comprise a lower (or higher) number of delay elements 8, however. The maximum determined number of delay elements 8 of the delay line that are passed through by the timing signal b during the time intervals Δt or T, for example, is limited in the known arrangement in FIG. 4 due to the limited length of the delay line 1. In contrast, with the aid of the inventive arrangement an arbitrarily large number of passed delay elements can be obtained, as well as an arbitrarily great period T of the timing signal a and an arbitrarily great phase shift Δt between the timing signals a and b, accordingly.

Although other modifications and changes may be suggested by those skilled in the art, it is the intention of the inventors to embody within the patent warranted hereon all changes and modifications as reasonably and properly come within the scope of their contribution to the art.

I claim:

1. A method for determining a phase difference between first and second timing signals, said first and second timing signals being of a digital nature and a pulse period of the second timing signal being known, comprising the steps of:

a) feeding the first timing signal to a first delay element of a plurality of serially connected delay elements, said plurality of serially connected delay elements forming a delay line so that the first timing signal passes through individual ones of said delay elements of the delay line in succession;

b) determining a first total number of delay elements of the delay line that are passed through by the first timing signal during a time-span between a timing pulse edge of the first timing signal and a subsequent timing pulse edge with a same polarity of the second timing signal;

c) determining a second total number of delay elements of the delay line that are passed through by the first timing signal between a further timing pulse edge and a subsequent further timing pulse edge with a same polarity of the second timing signal;

d) determining a delay time of each delay element of the delay line as a quotient of the pulse period of the second timing signal and the second total number of delay elements which was determined in step c); and e) determining a phase difference between the first and second timing signals dependent on the first total number of delay elements which was determined in step b) and on the delay time of each delay element of the delay line which was determined in step d); wherein in step a) the first timing signal is fed back to the first delay element of the delay line subsequent to passing through all individual delay elements of the delay line so that the delay line is passed through multiple times, and counting said passing through all individual delay elements of the delay line as a number of complete passes of the first timing signal through the delay line, in step b) the first total number of delay elements is determined in additional consideration of the number of complete passes of the first timing signal through the delay line, said number of complete passes of the first timing signal through the delay line being determined by a pass-through determiner, and in step c) the second total number of delay elements is determined in additional consideration of the number of passes of the first timing signal through the delay line at the determination time of the second total number of delay elements.

2. A method according to claim 1, wherein in step e) a phase difference between the two timing signals is determined by multiplying the first total number of delay elements which was determined in step b) by the delay time of each delay element of the delay line which was determined in step d).

3. An arrangement for determining a phase difference between a first and a second timing signal, said first and second timing signals being of a digital nature and a pulse period of the second timing signal being known, comprising:

a delay line including a plurality of serially connected delay elements at which said delay line the first timing signal is applied so that the first timing signal passes through individual ones of the delay elements of the delay line in succession;

a first register for storing first transit time information corresponding to a first total number of the delay elements of the delay line that are passed through by the first timing signal during a time-span between a timing pulse edge of the first timing signal and a subsequent timing pulse edge with a same polarity of the second timing signal;

a second register for storing second transit time information corresponding to a second total number of the delay elements of the delay line that have passed through by the first timing signal between a timing pulse edge and a subsequent timing pulse edge with a same polarity of the second timing signal;

an evaluator that determines a delay time of the delay elements of the delay line as well as a phase difference between the first and second timing signals dependent on the transit time information stored in the first and second registers;

a sequence control system that feeds the first timing signal to the delay line multiple times and a pass-through determiner determines a number of passes of the first timing signal through the delay line;

the first transit time information stored in the first register contain information about the number of passes of the first timing signal determined by the pass-through determiner through the delay line during the time-span between a timing pulse edge of the first timing signal and a subsequent timing pulse edge with a same polarity of a second timing signal; and the second transit time information stored in the second register contain information about the number of passes of the first timing signal determined by the pass-through determiner through the delay line during the pulse period of the second timing signal.

4. An arrangement according to claim 3, wherein the pass-through determination means is one of a counter and a shift register.

5. An arrangement according to claim 3, wherein said evaluator is a microprocessor.

6. An arrangement according to claim 3, wherein the evaluator determines the delay time of the delay elements of the delay line using the transit time information stored in the second register; and the evaluator determines the phase difference between the first and second timing signals using the thusly determined delay time of each delay element of the delay line as well as the first transit time information stored in the first register.

7. An arrangement according to claim 3, wherein the delay line contains ten delay elements.

8. An arrangement according to claim 3, wherein the delay elements of the delay line have an adjustable delay time, and a phase compensating means is provided which adjusts the delay time of the delay elements of the delay line such that a phase difference between a signal exiting at the output of the delay line and the second timing signal is compensated.

9. An arrangement according to claim 8, wherein the phase compensating means is integrated in the evaluator.

10. A method for determining a phase difference between first and second timing signals, said first and second timing signals being of a digital nature and a pulse period of the second timing signal being known, comprising the steps of:

a) feeding the first timing signal to a first delay element of a plurality of serially connected delay elements, said plurality of serially connected delay elements forming a delay line so that the first timing signal passes through individual ones of said delay elements of the delay line in succession;

b) determining a first total number of delay elements of the delay line that are passed through by the first timing signal during a time-span between a timing pulse edge of the first timing signal and a subsequent timing pulse edge with a same polarity of the second timing signal;

c) determining a second total number of delay elements of the delay line that are passed through by the first timing signal between a timing pulse edge and a subsequent timing pulse edge with a same polarity of the second timing signal;

d) determining an averaged delay time of each delay element of the delay line as a quotient of the pulse period of the second timing signal and the second total number of delay elements which was determined in step c); and e) determining a phase difference between the first and second timing signals dependent on the first total number of delay elements which was determined in step b) and on the delay time of each delay element of the delay line which was determined in step d); wherein in step a) the first timing signal is fed back to the first delay element of the delay line subsequent to passing through all individual delay elements of the delay line so that the delay line is passed through multiple times, and counting said passing through all individual delay elements of the delay line as a number of complete passes of the first timing signal through the delay line by counting passing of a timing pulse edge of said second timing signal, in step b) the first total number of delay elements is determined in additional consideration of the number of complete passes of the first timing signal through the delay line, said number of complete passes of the first timing signal through the delay line being determined by a pass-through determiner, and in step c) the second total number of delay elements is determined in additional consideration of the number of passes of the first timing signal through the delay line at the determination time of the second total number of delay elements.

\* \* \* \* \*